United States Patent
Nishikawa

(10) Patent No.: US 6,346,822 B2
(45) Date of Patent: Feb. 12, 2002

(54) SEMICONDUCTOR INTEGRATED CIRCUIT HAVING DIAGNOSIS FUNCTION

(75) Inventor: Yoshikazu Nishikawa, Tokyo (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/735,757

(22) Filed: Dec. 13, 2000

(30) Foreign Application Priority Data

Dec. 14, 1999 (JP) .......................................... 11-354735

(51) Int. Cl.⁷ .............................................. G01R 31/28
(52) U.S. Cl. ........................... 326/16; 714/724; 714/728
(58) Field of Search ........................... 326/16, 46, 93; 714/728, 724, 726; 324/765, 76.82

(56) References Cited

U.S. PATENT DOCUMENTS

| | | |
|---|---|---|
| 4,503,537 A | 3/1985 | McAnney |
| 4,513,418 A | 4/1985 | Bardell, Jr. et al. |
| 4,519,078 A | 5/1985 | Komonytsky |
| 4,683,569 A | 7/1987 | Rubin |
| 6,061,817 A * | 5/2000 | Jones et al. .................. 714/738 |
| 6,134,652 A * | 10/2000 | Warren ........................ 712/227 |

* cited by examiner

Primary Examiner—Michael Tokar
Assistant Examiner—Daniel D. Chang
(74) Attorney, Agent, or Firm—Pearne & Gordon LLP

(57) ABSTRACT

A semiconductor integrated circuit having a diagnosis function includes a scan chain arrangement block 2 in which a plurality of flip-flops are connected so that they can be shift-registered, and designed in a scan-path manner; a shift register 3 for storing required bits of a first random number pattern shifted by the block 2; another shift register 4 for storing required bits of a second random number pattern supplied to the block 2; and a comparator for comparing corresponding bits of the random number patterns stored in the shift registers 3 and 4 to detect whether all the bits of the random number patterns agree or disagree with each other, thereby verifying a normal operation of the block 2. In this configuration, the operating state of the semiconductor integrated circuit can be diagnosed with the number of connecting wires connected to it being minimized.

6 Claims, 4 Drawing Sheets

SEMICONDUCTOR INTEGRATED CIRCUIT HAVING DIAGNOSIS FUNCTION

BACKGROUND OF THE INVENTION

1. Field of the Invention

The present invention relates to a semiconductor integrated circuit having a diagnosis function for diagnosing a circuit operation.

2. Description of the Related Art

In order to reduce the number of inferior products of available semiconductor integrated circuits, at the stage of initial inspection, it is necessary to remove the semiconductor integrated circuits which have possibility of failure owing to infant mortality. For this purpose, the operation of a semiconductor integrated circuit is verified by externally monitoring an output signal in response to an input signal supplied to the semiconductor integrated circuit.

In recent years, the semiconductor integrated circuit has been subjected to "burn-in" testing in which stress is applied to the semiconductor integrated circuit in a state where it is set within a constant temperature chamber and the semiconductor integrated circuit is tested acceleratively.

Where the operation of the semiconductor integrated circuit is tested, it is preferable to monitor the signals produced from all the terminals of the semiconductor integrated circuit. However, generally, since a plurality of semiconductor integrated circuits are tested simultaneously, it is almost impossible to monitor the signals from all the terminals of each of the semiconductor integrated circuits.

Further, in the burn-in testing, the number of connecting wires, which can be connected to the semiconductor integrated circuit located in the chamber, is limited. Therefore, it is desired to test the semiconductor integrated circuit using a necessary minimum number of connecting wires.

SUMMARY OF THE INVENTION

The present invention has been accomplished under the above circumstance.

An object of the invention is to provide a semiconductor integrated circuit which has a diagnosis function capable of diagnosing its operation state using a necessary minimum number of connecting wires connectable to itself.

In order to attain the above object, in accordance with the first aspect of the invention, there is provided a semiconductor integrated circuit having a diagnosis function comprising: a logic circuit to which a random number pattern is supplied, said logic circuit designed in a scan-path manner and having a plurality of flip-flops which can be shift-registered; a first shift register for storing required bits of a first random number pattern shifted by said logic circuit; a second shift register for storing required bits of a first random number pattern supplied to said logic circuit; and means for comparing corresponding bits of the random number patterns stored in the first and the second shift register to detect whether all the bits of the first and second random number patterns agree or disagree with each other, thereby verifying a normal operation of said logic circuit.

In this configuration, the operating state of the logic circuit can be verified by detecting whether corresponding bits of the random number patterns supplied to the logic circuit and passed therethrough agree (agreement of all bits) or agree in their inverted state (agreement of inverted all bits) with each other.

In accordance with the second aspect of the invention, there is a provided semiconductor integrated circuit having a diagnosis function comprising: a logic circuit to which a pseudorandom number pattern of a string of M bits touring at a period of $(2^M-1)$ and not having a repetition within the period is supplied, said logic circuit designed in a scan-path manner and having a plurality of flip-flops which can be shift-registered; a shift register for storing required bits of a first random number pattern shifted by said logic circuit; holding means for holding data for comparison composed of any string of bits of said pseudorandom number pattern; and comparing means for comparing corresponding bits of the random number pattern stored in said shift register and data for comparison held in said holding means to detect whether all the bits of the random number patterns agree and/or disagree with each other, thereby verifying a normal operation of said logic circuit.

In this configuration, noting that strings of bits of a pseudorandom number pattern touring at a prescribed period are not repeated within the period, data corresponding to any one of strings of bits constituting the pseudorandom number pattern is set for comparison. The operating state of the logic circuit can be verified by detecting whether corresponding bits of the set data for comparison and the pseudorandom number pattern passed through the logic circuit agree (agreement of all bits) and/or agree in their inverted state (agreement of inverted all bits) with each other.

In accordance with the first and the second aspect of the invention, the signal indicative of the normal operation of the logic circuit can be derived through a single connecting wire so that it is not necessary to connect connecting wires to all the terminals of the logic circuit. This permits the operating state of the semiconductor integrated circuit to be diagnosed using a necessary and minimum number of connecting wires. Further, in accordance with the second aspect of the invention, using a periodical random number pattern, the data to be compared with the data passed through the logic circuit is previously fixed. This makes it unnecessary to take in the data for comparison, thereby reducing the circuit scale.

Preferably, the semiconductor integrated circuit having a diagnosis function further includes determination means which produces a success decision signal when the normal operation of said logic circuit is verified by said comparing means and an error decision signal when the normal operation of said logic circuit is not verified within a prescribed time by said comparing means.

In this configuration, the operating state of the logic circuit can be verified in the above manner within the limited time.

Namely, since the operating state of the semiconductor integrated circuit can be diagnosed with a limited time, where the agreement/disagreement of all bits is not detected owing to failure of the operation within the limited time, diagnosis is stopped immediately to save the time required for diagnosis.

Preferably, the semiconductor integrated circuit having a diagnosis function further includes random number generating means for said random number pattern or pseudorandom number pattern, wherein the logic circuit is subjected to burn-in testing of applying suitable stress to said logic circuit, thereby verifying the normal operation of said logic circuit.

This configuration does not require the connecting wire for supplying the random number pattern to the semiconductor integrated circuit.

Specifically, since the terminals of the semiconductor integrated circuit are not occupied to supply the random pattern or pseudorandom pattern, the semiconductor integrated circuit can be diagnosed using the necessary and minimum number of connecting wires inclusive of the input terminals. This is particularly efficient for executing the burn-in testing in which the number of connecting wires connectable to the semiconductor integrated circuit is limited.

The above and other objects and features of the invention will be more apparent from the following description taken in conjunction with the accompanying drawings.

DESCRIPTION OF THE PREFERRED EMBODIMENTS

Figure 1:
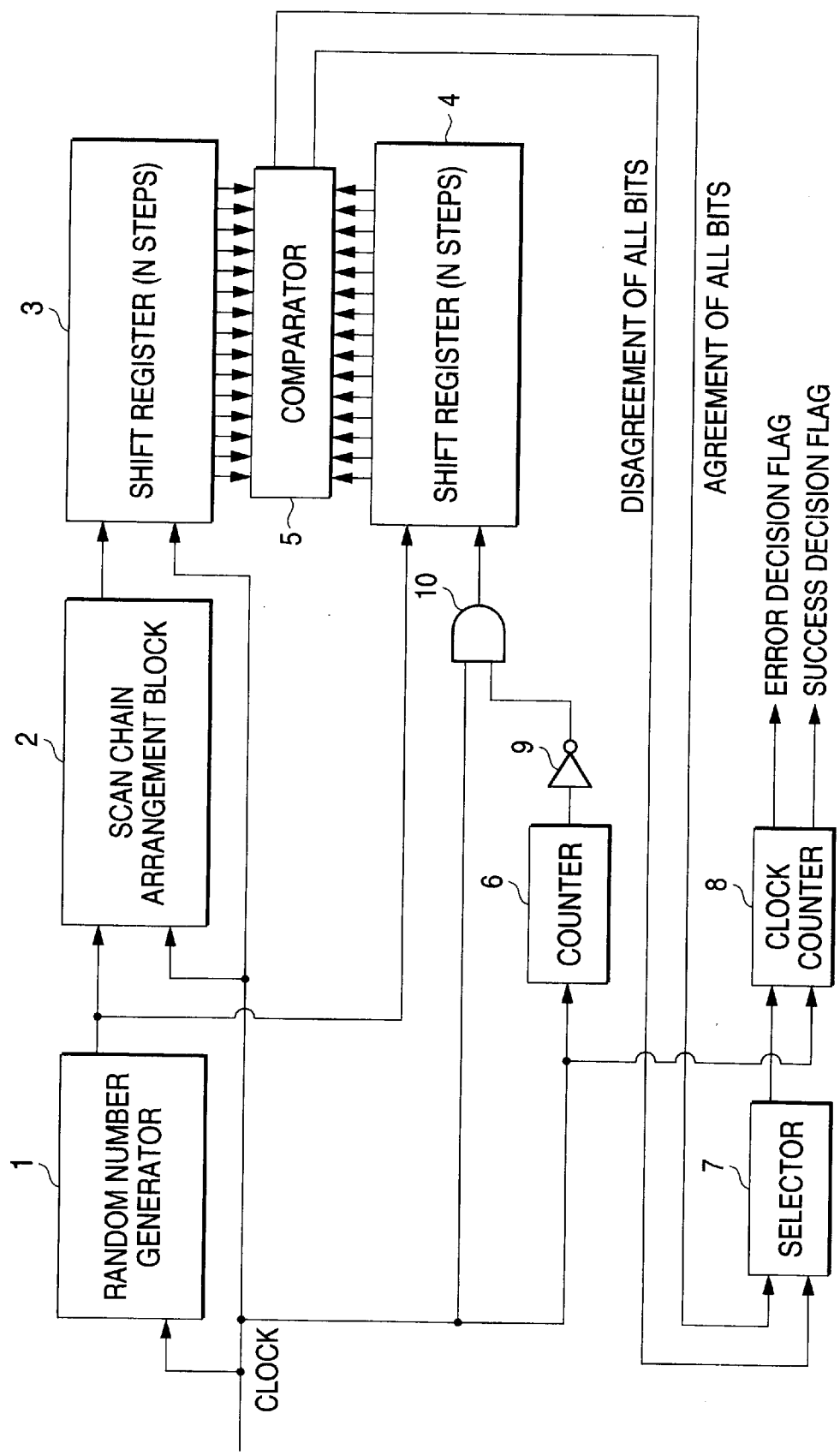
FIG. 1 is a block diagram of a semiconductor integrated circuit according to a first embodiment of the invention.

Now referring to the drawings, an explanation will be given of various embodiments of the invention.

Embodiment 1

FIG. 1 shows a first embodiment of the invention. In FIG. 1, reference numeral 1 denotes a random number generator, 2 a scan chain arrangement block (logic circuit) in which a plurality of flip-flops are connected like a chain across a combination circuit so that they can be shift-registered, and designed in a scan-path manner; 3 an N-step shift register (first shift register); 4 an N-step shift register (second shift register); 5 a comparator; 6 a counter; 7 a selector; 8 a clock counter; 9 an inverter circuit; and 10 an AND circuit.

In the arrangement described above, first, all the functions are initialized by a reset signal. A the reset is released, a random number pattern generated by the random number generator 1 is supplied to the flip-flops in the scan chain arrangement block 3 and also supplied to the shift register 4.

After the reset is released, the counter 6 starts to count clocks supplied to its one end. When the number of counts reaches N indicative of the number of steps of the shift registers 3 and 4, the counter 6 supplies a control signal to stop the shifting operation of the shift register 4. Thereby, the shift register 4 holds the first N-bits of the random number pattern.

The random number pattern supplied to the scan chain arrangement block 2 is shifted by the flip-flops constituting the scan chain and is supplied to the shift register 3. The random number pattern supplied to the scan chain arrangement block 2 is propagated through the flip-flops while it repeats the shifting operation. Therefore, if the scan chain arrangement block 2 operates normally, its output produces entirely the same pattern as the supplied random number pattern or the pattern with all the polarities inverted according to the polarities of the flip-flops constituting the scan chain. The string of the N bits held in the shift registers 3 and 4 are supplied to the comparator 5, respectively.

The comparator 5 compares the corresponding bits of the respective data stored in the shift registers 3 and 4. If all the N bits agree with each other, the comparator 5 generates a signal indicative of agreement of all-bits. If the all the N bits do not agree with each other, the comparator 5 generates a signal indicative of disagreement of all the bits. The signal indicative of the agreement/disagreement of all the bits is supplied to the selector 7 through a single connecting wire.

The selector selects either the signal of agreement of all the bits or the signal of disagreement of all the bits. The selected signal is supplied to the one terminal of the clock counter 8. A logical sum (OR) of the signal of agreement of all the bits and the signal of disagreement of all the bits may be supplied to the clock counter 8.

The clock counter 8 starts to count the clocks supplied to the other terminal after the reset has been released and ceases to count when it recognizes the signal of agreement of all the bits or the signal of disagreement of all the bits. The clock counter 8 previously sets the value not smaller than the number of the connected steps of the flip-flops in the scan chain arrangement block 2. Before the clock counter 8 recognizes this value, if it recognizes the signal of agreement of all the bits or the signal of disagreement of all the bits, it produces a success decision flag. If not, it produces an error decision flag.

If there is failure in a part of the flip-flops within the scan chain arrangement block 2, the random number pattern is not propagated accurately. Therefore, the signal of agreement of all the bits or the signal of disagreement of all the bits which represents the normal operation of the scan chain arrangement block is not detected. In this case, since the counted value of the clock counter 8 exceeds the prescribed value, the counter clock 8 generates an error decision flag. Thus, the erroneous operation (or malfunction) of the semiconductor integrated circuit is determined.

As regards the relationship between the shift register 3 and scan chain arrangement block 2, the data consisting of a string of bits equal to or smaller than the number of steps of the flip-flops can be used for comparison. Otherwise, the data consisting of a string of bits larger than the number of steps of the flip-flops may be used for comparison.

Embodiment 2

Figure 2:
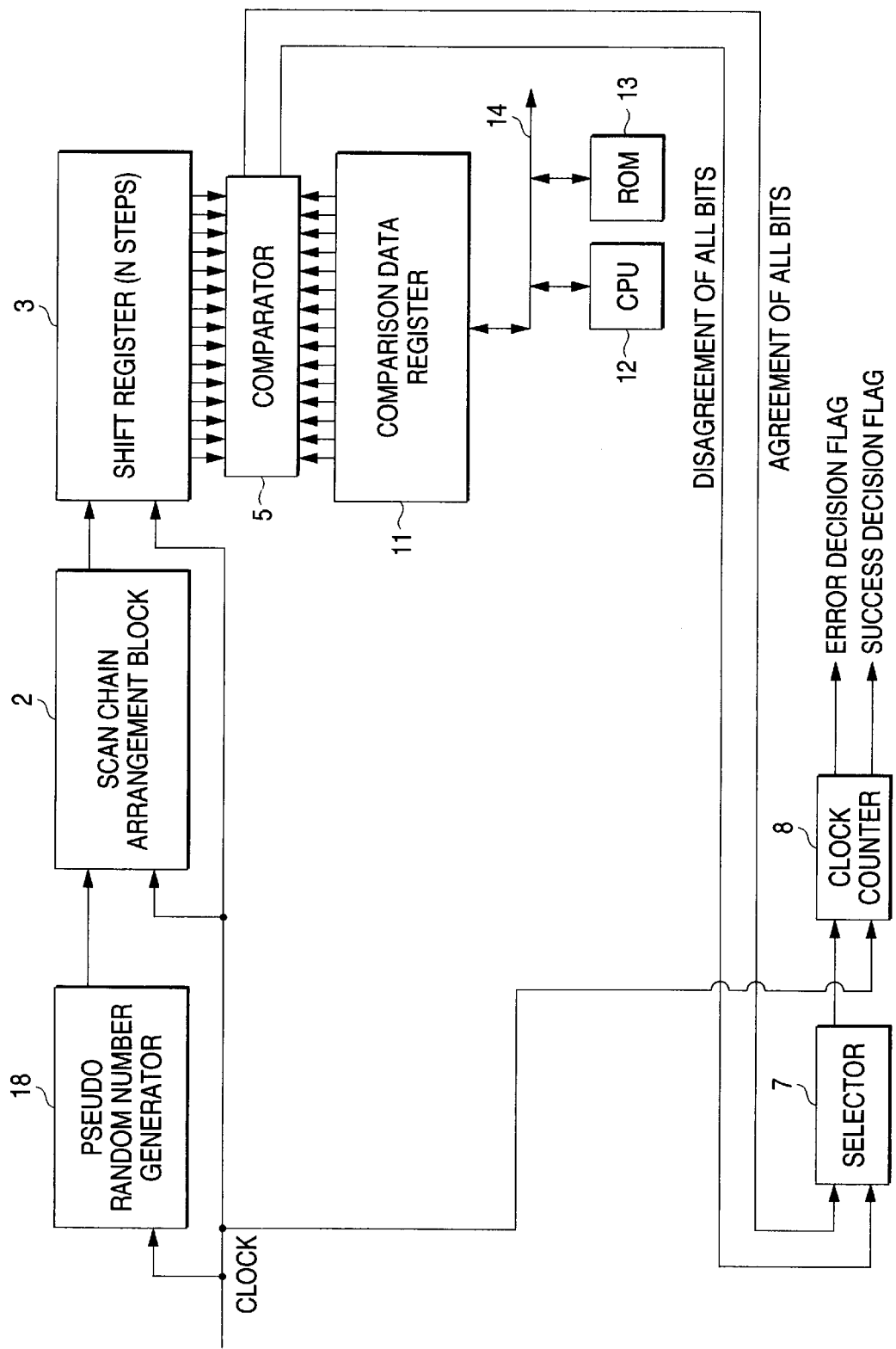
FIG. 2 is a block diagram of a semiconductor integrated circuit according to a second embodiment of the invention.

An explanation will be given of a second embodiment of the present invention. FIG. 2 shows a second embodiment of the invention. In FIG. 2, like reference numerals refer to like parts in the first embodiment shown in FIG. 1. In FIG. 2, reference numeral 11 denotes a data register for comparison (holding means); 12 a CPU (central processing unit); 13 a ROM (read-only memory); 14 a data path; and 18 a pseudorandom number generator.

Figure 3:
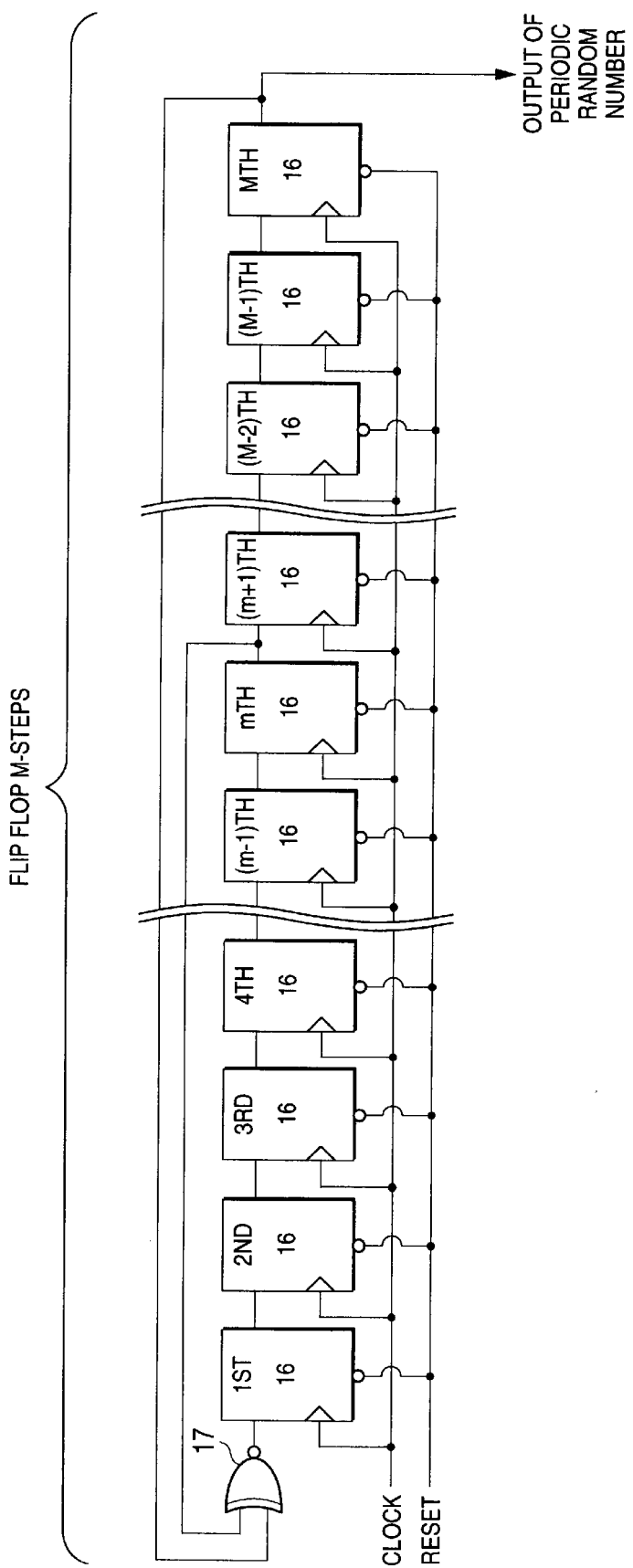
FIG. 3 is a block diagram of a pseudorandom number generator in the second embodiment.

The pseudorandom number generator 18, in which as shown in FIG. 3, the output from any m-th step in M steps of flip-flops 16 and the output from the final M-th step thereof are supplied to the first step flip-flop through a logical exclusive-OR circuit 17, uses the output from the final M-th step flip-flop as a random number output. In this case, if the initial values of M steps of flip-flops are a combination other than "all 1", a random number pattern touring at a period of $(2^M-1)$ is generated. The successive M-bits pattern of the random number pattern has a combination in which is not a repetition within the one period and other than "all 1" among the strings of combinations of M bits within the one period.

In the arrangement described above, first, all the functions are initialized by a reset signal. After the reset is released, a pseudorandom number pattern generated by the pseudorandom number generator 18 is supplied to the flip-flops in the scan chain arrangement block 2.

The comparison data register 11 stores any one of a plurality data stored in the ROM 13 under the control of CPU 12. The data stored in the data register 11 is compared with the random number pattern shifted by the scan chain arrangement block 2 and stored in the shift register 3. The pattern for comparison stored in the ROM 13 is the data corresponding to any one of a plurality of data created by the pseudorandom number pattern which are not repeated within one period. One of these plurality of data which can be set by the ROM 13 is selected for comparison under the control by the CPU 12.

If the scan chain arrangement block 2 operates normally, its output produces entirely the same pattern as the supplied random number pattern or the pattern with all the polarities inverted according to the polarities of the flip-flops constituting the scan chain. The string of the N bits held in the shift registers 3 and comparison data register 11 are supplied to the comparator 5, respectively.

The comparator 5 compares the corresponding bits of the respective data stored in the shift registers 3 and comparison data register 11. If all the N bits agree with each other, the comparator 5 generates a signal indicative of agreement of all-bits. If the all the N bits do not agree with each other, the comparator 5 generates a signal indicative of disagreement of all the bits. The signal indicative of the agreement/disagreement of all the bits is supplied to the selector 7 through a single connecting wire.

The clock counter 8 starts to count the clocks supplied to the other terminal after the reset has been released and ceases to count when it recognizes the signal of agreement of all the bits or the signal of disagreement of all the bits. The clock counter 8 previously sets a prescribed value (which is the number of the connected steps of the flip-flops in the scan chain arrangement block 2+the period ($2^M-1$) of the pseudorandom number pattern). Before the clock counter 8 recognizes this value, if it recognizes the signal of agreement of all the bits and/or the signal of disagreement of all the bits, it produces a success decision flag. If not, it produces an error decision flag.

[0028]

The data for comparison stored in the comparison data register 11 may agree with all the bits of the random number pattern stored in the shift register 3, or may disagree with all the bits of the random number pattern subsequently shifted. Therefore, by inputting the logical product of the signal of agreement of all the bits and the signal of disagreement of all the bits to the clock counter 8, more reliable determination can be performed.

Preferably, the number M of steps of the flip-flops constituting the pseudorandom number generator 18 is made equal to the number N of the bits of the random number pattern for comparison stored in the shift register 3. In this case, since agreement or disagreement of all the bits occurs at only one point within the one period of the random number pattern created by the pseudorandom number generator, more reliable determination can be performed.

Incidentally, in the pseudorandom number generator 18 as shown in FIG. 3, the output form the exclusive-OR circuit 17 is inverted so that the string of the M bits of the created random number pattern does not have the value of "all 1". Therefore, where agreement and disagreement of all the bits are detected, the data for comparison other than "all 1" or "all 0" must be set in the comparison data register 11.

Embodiment 3

Figure 4:
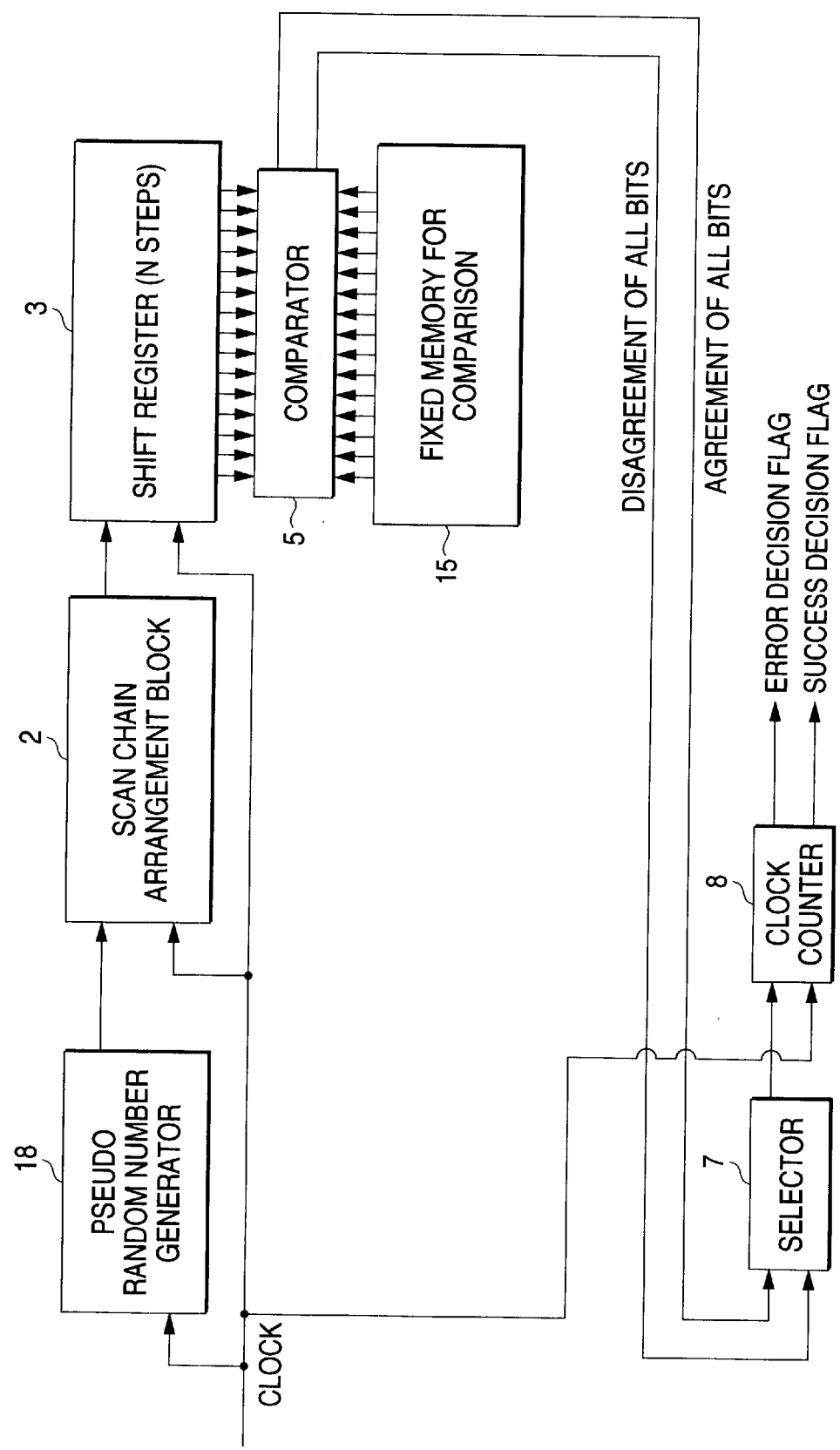
FIG. 4 is a block diagram of a semiconductor integrated circuit according to a third embodiment of the invention.

Referring to FIG. 4, an explanation will be given of a third embodiment of the present invention. In FIG. 4, like reference numerals refer to like parts in second embodiment shown in FIG. 2. This third embodiment is different from the second embodiment in that a fixed data memory for comparison (holding means) 15 is provided in place of the comparison data register 11. Specifically, the fixed data memory for comparison 14 previously stores a prescribed data which is to be compared with the random number stored in the shift register 3.

In accordance with the second and the second embodiment, the counter 6 required by the first embodiment is not required. The shift register 4 provided with the means for acquiring the random number created is not required. This contributes to reduce the scale of the semiconductor integrated circuit having a diagnosis function according to the invention.

Further, the semiconductor integrated circuit according to the invention incorporates the random number generator 1 for creating a random number pattern in the first embodiment and the pseudorandom number generator 18 for creating a pseudorandom number pattern in the second and the third embodiment. In this case, the random number pattern can be created within the semiconductor integrated circuit. This is particularly efficient for the case where the number of connectable connecting wires like burn-in testing is limited.

The random number pattern used in the first embodiment may be replaced by the pseudorandom number pattern created by the pseudorandom number generator shown in FIG. 3.

What is claimed is:

1. A semiconductor integrated circuit having a diagnosis function comprising:

a logic circuit to which a random number pattern is supplied, said logic circuit designed in a scan-path manner and having a plurality of flip-flops which can be shift-registered;

a first shift register for storing required bits of a first random number pattern shifted by said logic circuit;

a second shift register for storing required bits of a first random number pattern supplied to said logic circuit; and means for comparing corresponding bits of the random number patterns stored in the first and the second shift register to detect whether all the bits of the first and second random number patterns agree or disagree with each other, thereby verifying a normal operation of said logic circuit.

2. A semiconductor integrated circuit having a diagnosis function according to claim 1 further comprising:

determination means which produces a success decision signal when the normal operation of said logic circuit is verified by said comparing means and produces an error decision signal when the normal operation of said logic circuit is not verified within a prescribed time by said comparing means.

3. A semiconductor integrated circuit having a diagnosis function according to claim 1 further comprising:

random number generating means for said random number pattern or pseudorandom number pattern, wherein the logic circuit is subjected to burn-in testing of applying suitable stress to said logic circuit, thereby verifying the normal operation of said logic circuit.

4. A semiconductor integrated circuit having a diagnosis function comprising:

a logic circuit to which a pseudorandom number pattern of a string of M bits touring at a period of ($2^M-1$) and not having a repetition within the period is supplied, said logic circuit designed in a scan-path manner and having a plurality of flip-flops which can be shift-registered;

a shift register for storing required bits of a first random number pattern shifted by said logic circuit;

holding means for holding data for comparison composed of any string of bits of said pseudorandom number pattern; and comparing means for comparing corresponding bits of the random number pattern stored in said shift register and data for comparison held in said holding means to detect whether all the bits of the random number patterns agree and/or disagree with each other, thereby verifying a normal operation of said logic circuit.

5. A semiconductor integrated circuit having a diagnosis function according to claim 4 comprising:

determination means which produces a success decision signal when the normal operation of said logic circuit is verified by said comparing means and produces an error decision signal when the normal operation of said logic circuit is not verified within a prescribed time by said comparing means.

6. A semiconductor integrated circuit having a diagnosis function according to claim 4 further comprising:

random number generating means for said random number pattern or pseudorandom number pattern, wherein the logic circuit is subjected to burn-in testing of applying suitable stress to said logic circuit, thereby verifying the normal operation of said logic circuit.

* * * * *